(12) United States Patent
Cha

(10) Patent No.: US 12,279,052 B2
(45) Date of Patent: Apr. 15, 2025

(54) IMAGE SENSOR

(71) Applicant: SK hynix Inc., Gyeonggi-do (KR)

(72) Inventor: Su Ram Cha, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 177 days.

(21) Appl. No.: 18/084,686

(22) Filed: Dec. 20, 2022

(65) Prior Publication Data

US 2023/0412933 A1 Dec. 21, 2023

(30) Foreign Application Priority Data

Jun. 17, 2022 (KR) .......................... 10-2022-0074353

(51) Int. Cl.
*H04N 25/13* (2023.01)
*H01L 27/146* (2006.01)
*H04N 25/78* (2023.01)

(52) U.S. Cl.
CPC ..... *H04N 25/135* (2023.01); *H01L 27/14621* (2013.01); *H04N 25/136* (2023.01); *H04N 25/78* (2023.01)

(58) Field of Classification Search
CPC .... H04N 25/135; H04N 25/78; H04N 25/136; H04N 25/42; H04N 25/77; H04N 25/44; H04N 25/13; H04N 25/75; H01L 27/14603; H01L 27/14621
See application file for complete search history.

(56) References Cited

U.S. PATENT DOCUMENTS

| 7,259,788 | B1 * | 8/2007 | Olding | H01L 27/14806 |
| | | | | 348/277 |
| 8,139,130 | B2 | 3/2012 | Compton et al. | |
| 9,451,221 | B2 * | 9/2016 | Hirota | G02B 13/0015 |
| 11,825,217 | B2 * | 11/2023 | Cha | H04N 25/75 |
| 2012/0218426 | A1 * | 8/2012 | Kaizu | H04N 25/75 |
| | | | | 348/241 |
| 2012/0287294 | A1 * | 11/2012 | Kaizu | H04N 25/59 |
| | | | | 348/E5.037 |
| 2016/0191866 | A1 * | 6/2016 | Onishi | H04N 25/60 |
| | | | | 348/270 |
| 2018/0131883 | A1 * | 5/2018 | Takado | H04N 23/95 |
| 2018/0227550 | A1 * | 8/2018 | Fossum | H04N 25/133 |

(Continued)

FOREIGN PATENT DOCUMENTS

CN 113676629 A * 11/2021 ............. H04N 23/55
KR 10-2019-0087017 A 7/2019

*Primary Examiner* — Abdelaaziz Tissire
(74) *Attorney, Agent, or Firm* — IP & T GROUP LLP

(57) ABSTRACT

Disclosed is an image sensor including a pixel array, wherein the pixel array includes a first sub-pixel array including pixels disposed in a first diagonal direction and each having a green filter, and pixels disposed in a second diagonal direction and each having a yellow filter; a second sub-pixel array including pixels disposed in the first diagonal direction and each having the green filter, and pixels disposed in the second diagonal direction and each having the yellow filter; a third sub-pixel array including pixels disposed in the second diagonal direction and each having a red filter, and pixels disposed in the first diagonal direction and each having a magenta filter; and a fourth sub-pixel array including pixels disposed in the second diagonal direction and each having a blue filter, and pixels disposed in the first diagonal direction and each having a cyan filter.

22 Claims, 6 Drawing Sheets

(56) References Cited

U.S. PATENT DOCUMENTS

| | | | | |
|---|---|---|---|---|
| 2021/0344882 A1* | 11/2021 | Park | ............... | H04N 25/616 |
| 2022/0093666 A1* | 3/2022 | Koskinen | ............... | H04N 25/13 |
| 2023/0127881 A1* | 4/2023 | Ogasahara | ............... | H04N 9/77 |
| | | | | 348/207.99 |
| 2023/0140768 A1* | 5/2023 | Nakata | ............... | H04N 23/13 |
| | | | | 348/220.1 |
| 2024/0163574 A1* | 5/2024 | Watanabe | ............... | G06T 7/0012 |

* cited by examiner

| G | R | G | R |
|---|---|---|---|
| B | G | B | G |
| G | R | G | R |
| B | G | B | G |

[Bayer Pattern]

| G | Y | M | R |
|---|---|---|---|
| Y | G | R | M |
| C | B | G | Y |
| B | C | Y | G |

[New Pattern]

(B)

| B | G | B | G |
|---|---|---|---|
| G | R | G | R |
| B | G | B | G |
| G | R | G | R |

[Bayer Pattern]

| B | C | Y | G |
|---|---|---|---|
| C | B | G | Y |
| Y | G | R | M |
| G | Y | M | R |

[New Pattern]

(C)

| R | G | R | G |
|---|---|---|---|
| G | B | G | B |
| R | G | R | G |
| G | B | G | B |

[Bayer Pattern]

| R | M | Y | G |
|---|---|---|---|
| M | R | G | Y |
| Y | G | B | C |
| G | Y | C | B |

[New Pattern]

(D)

| G | B | G | B |
|---|---|---|---|
| R | G | R | G |
| G | B | G | B |
| R | G | R | G |

[Bayer Pattern]

| G | Y | C | B |
|---|---|---|---|
| Y | G | B | C |
| M | R | G | Y |
| R | M | Y | G |

[New Pattern]

IMAGE SENSOR

CROSS-REFERENCE TO RELATED APPLICATION(S)

This application claims priority under 35 U.S.C. § 119 to Korean Patent Application No. 10-2022-0074353, filed on Jun. 17, 2022, the disclosure of which is incorporated herein by reference in its entirety.

BACKGROUND

1. Field

Various embodiments of the present disclosure relate to a semiconductor design technique, and more particularly, to an image sensor.

2. Description of the Related Art

Image sensors are sensors for capturing images using the property of a semiconductor which reacts to light. Image sensors may be roughly classified into charge-coupled device (CCD) image sensors and complementary metal-oxide semiconductor (CMOS) image sensors. Recently, CMOS image sensors are widely used because the CMOS image sensors can allow both analog and digital control circuits to be directly implemented on a single integrated circuit (IC).

SUMMARY

Various embodiments of the present disclosure are directed to an image sensor that may generate an optimized color image in a low-contrast mode and a high-contrast mode.

In accordance with an embodiment of the present disclosure, an image sensor may include a pixel array having a 4×4 unit pixel structure, and the pixel array may include: a first sub-pixel array including first and second pixels disposed in a first diagonal direction and each having a green filter, and third and fourth pixels disposed in a second diagonal direction and each having a yellow filter, the first and second diagonal directions intersecting each other; a second sub-pixel array including fifth and sixth pixels disposed in the first diagonal direction and each having the green filter, and seventh and eighth pixels disposed in the second diagonal direction and each having the yellow filter; a third sub-pixel array including ninth and 10$^{th}$ pixels disposed in the second diagonal direction and each having a red filter, and 11$^{th}$ and 12$^{th}$ pixels disposed in the first diagonal direction and each having a magenta filter; and a fourth sub-pixel array including 13$^{th}$ and 14$^{th}$ pixels disposed in the second diagonal direction and each having a blue filter, and 15$^{th}$ and 16$^{th}$ pixels disposed in the first diagonal direction and each having a cyan filter.

In accordance with an embodiment of the present disclosure, an image sensor may include a pixel array including N×M pixels, where N and M are natural numbers greater than 2, and the pixel array may include: first pixels disposed along a first diagonal line and each having a green filter; at least one second pixel having a yellow filter, at least one third pixel having a red filter and at least one fourth pixel having a blue filter, the second to fourth pixels being disposed along a second diagonal line parallel to the first diagonal line; at least one fifth pixel having a magenta filter and at least one sixth pixel having a cyan filter, the fifth and sixth pixels being disposed along a third diagonal line parallel to the second diagonal line; and at least one seventh pixel having the yellow filter, at least one eighth pixel having the red filter and at least one ninth pixel having the blue filter, the seventh to ninth pixels being disposed along a fourth diagonal line parallel to the third diagonal line.

In accordance with an embodiment of the present disclosure, an image sensor may include a 4×4 pixel-array, and the pixel-array may include: first and second sub-arrays arranged along a first diagonal direction; and third and fourth sub-arrays arranged along a second diagonal direction intersecting the first diagonal direction, wherein: the first sub-array includes 1st and 2nd pixels of a green filter arranged along the first diagonal direction, and 3rd and 4th pixels of a yellow filter arranged along the second diagonal direction; the second sub-array includes 5th and 6th pixels of the green filter arranged along the first diagonal direction, and 7th and 8th pixels of the yellow filter arranged along the second diagonal direction; the third sub-array includes 9th and 10th pixels of a red filter arranged along the second diagonal direction, and 11th and 12th pixels of a magenta filter arranged along the first diagonal direction; and the fourth sub array includes 13th and 14th pixels of a blue filter arranged along the second diagonal direction, and 15th and 16th pixels of a cyan filter arranged along the first diagonal direction.

The first sub-array may be disposed on a top-left therein, and the third sub-array may be disposed on a top-right therein.

The first sub-array may be disposed on a top-right therein, and the third sub-array may be disposed on a bottom-right therein.

The first sub-array may be disposed on a top-right therein, and the third sub-array may be disposed on a top-left therein.

The first sub-array may be disposed on a top-left therein, and the third sub-array may be disposed on a bottom-left therein.

BRIEF DESCRIPTION OF THE DRAWINGS

FIG. 3 is a set of diagrams illustrating a 4×4 unit pixel structure illustrated in FIG. 2 with their corresponding Bayer patterns in accordance with an embodiment of the present disclosure.

FIG. 4 is a diagram illustrating an 8×8 unit pixel structure obtained by expanding an example (A) of the 4×4 unit pixel structure illustrated in FIG. 3 in accordance with an embodiment of the present disclosure, FIG. 5 is a diagram illustrating an 8×8 unit pixel structure obtained by expanding an example (B) of the 4×4 unit pixel structure illustrated in FIG. 3 in accordance with an embodiment of the present disclosure.

FIG. 6 is a diagram illustrating an 8×8 unit pixel structure obtained by expanding an example (C) of the 4×4 unit pixel structure illustrated in FIG. 3 in accordance with an embodiment of the present disclosure.

FIG. 7 is a diagram illustrating an 8×8 unit pixel structure obtained by expanding an example (D) of the 4×4 unit pixel structure in accordance with an embodiment of the present disclosure illustrated in FIG. 3.

DETAILED DESCRIPTION

Various embodiments of the present disclosure are described below with reference to the accompanying drawings, in order to describe in detail the present disclosure so that those with ordinary skill in art to which the present disclosure pertains may easily carry out the technical spirit of the present disclosure.

It will be understood that when an element is referred to as being "connected to" or "coupled to" another element, the element may be directly connected to or coupled to the another element, or electrically connected to or coupled to the another element with one or more elements interposed therebetween. In addition, it will also be understood that the terms "comprises," "comprising," "includes," and "including" when used in this specification do not preclude the presence of one or more other elements, but may further include or have the one or more other elements, unless otherwise mentioned. In the description throughout the specification, some components are described in singular forms, but the present disclosure is not limited thereto, and it will be understood that the components may be formed in plural.

Figure 1:
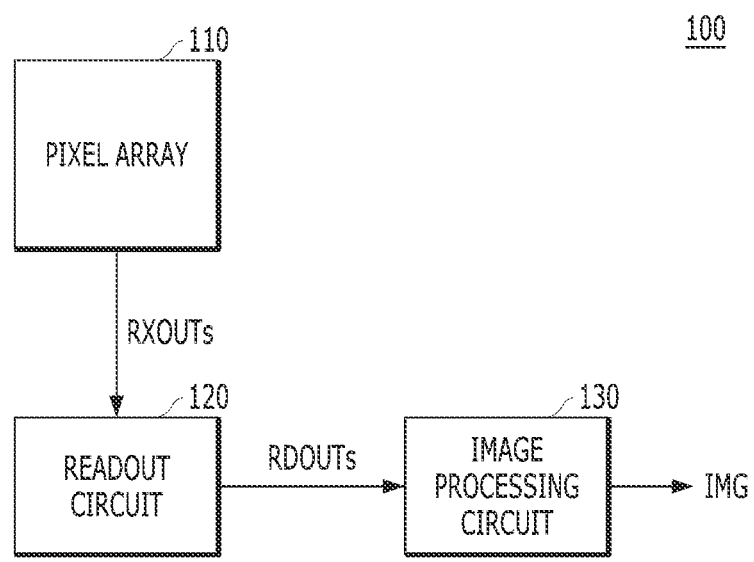
FIG. 1 is a block diagram illustrating an image sensor in accordance with an embodiment of the present disclosure.

FIG. 1 is a block diagram illustrating an image sensor 100 in accordance with an embodiment of the present disclosure.

Referring to FIG. 1, the image sensor 100 may include a pixel array 110, a readout circuit 120 and an image processing circuit 130.

The pixel array 110 may generate pixel signals PXOUTs corresponding to a captured image. Each of the pixel signals PXOUTs may be an analog signal.

The readout circuit 120 may generate image signals RDOUTs on the basis of the pixel signals PXOUTs. Each of the image signals RDOUTs may be a digital signal.

The image processing circuit 130 may generate an image IMG corresponding to the captured image, on the basis of the image signals RDOUTs. The image IMG may have a pattern different from a color filter pattern of the pixel array 110. The color filter pattern of the pixel array 110 may have a new pattern different from a Bayer pattern, and the image DIG may have the Bayer pattern. The new pattern of the pixel array 110 is described in detail below, FIG. 2 is a diagram illustrating an example of the pixel array 110 illustrated in FIG. 1 in accordance with an embodiment of the present disclosure.

Figure 2:
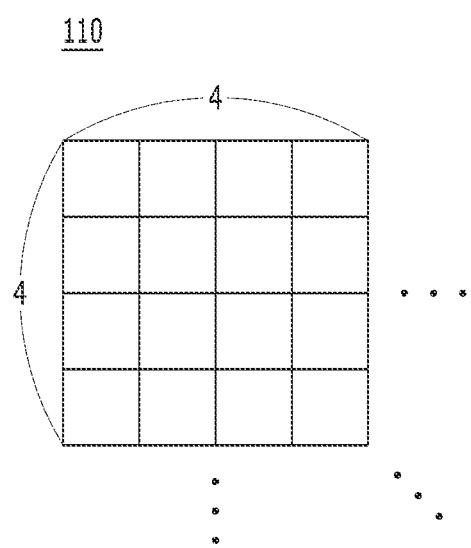
FIG. 2 is a diagram illustrating an example of a pixel array illustrated in FIG. 1 in accordance with an embodiment of the present disclosure.

Referring to FIG. 2, the pixel array 110 may include M×N pixels arranged at intersections of M rows and N columns, where N and M are natural numbers greater than 2. The pixel array 110 may have a pattern in which a 4×4 unit pixel structure is repeated. That is, 16 pixels may form one group, and each group may have the same pattern, that is, the new pattern. The new pattern may substantially refer to the color filter pattern of a color filter array included in the pixel array 110.

The 4×4 unit pixel structure may include first to fourth sub-pixel arrays in a unit of 2×2 pixels. Hereinafter, the sub-pixel array in the unit of 2×2 pixels located on the top left in the 4×4 unit pixel structure is referred to as the "first sub-pixel array", the sub-pixel array in the unit of 2×2 pixels located on the bottom right in the 4×4 unit pixel structure is referred to as the "second sub-pixel array", the sub-pixel array in the unit of 2×2 pixels located on the top right in the 4×4 unit pixel structure is referred to as the "third sub-pixel array", and the sub-pixel array in the unit of 2×2 pixels located on the bottom left in the 4×4 unit pixel structure is referred to as the "fourth sub-pixel array".

FIG. 3 is a set of diagrams illustrating the new pattern illustrated in FIG. 2 with their corresponding Bayer patterns in accordance with an embodiment of the present disclosure. Typically, the Bayer pattern may have a pattern in which 2×2 unit pixels are repeated, and is illustrated in a unit of 4×4 pixels corresponding to the new pattern.

Referring to FIG. 3, the Bayer pattern may be arranged as illustrated in (A) of FIG. 3. For example, in the Bayer pattern in the unit of 2×2 pixels, a pair of pixels each having a green filter G may be disposed in a first diagonal direction descending from left to right, and a pixel having a blue filter B and a pixel having a red filter R may be sequentially disposed in a second diagonal direction ascending from left to right.

In correspondence with the Bayer pattern arranged as illustrated in (A) of FIG. 3, the new pattern may be arranged as follows. In the first sub-pixel array, a pair of pixels each having a green filter G may be disposed in the first diagonal direction, and a pair of pixels each having a yellow filter Y may be disposed in the second diagonal direction. In the second sub-pixel array, a pair of pixels each having a green filter G may be disposed in the first diagonal direction, and a pair of pixels each having a yellow filter Y may be disposed in the second diagonal direction. In the third sub-pixel array, a pair of pixels each having a red filter R may be disposed in the second diagonal direction, and a pair of pixels each having a magenta filter M may be disposed in the first diagonal direction. In the fourth sub-pixel array, a pair of pixels each having a blue filter B may be disposed in the second diagonal direction, and a pair of pixels each having a cyan filter C may be disposed in the first diagonal direction.

The Bayer pattern may be arranged as illustrated in (B) of FIG. 3. For example, in the Bayer pattern in the unit of 2×2 pixels, a pixel having a blue filter B and a pixel having a red filter R may be sequentially disposed in the first diagonal direction, and a pair of pixels each having a green filter G may be disposed in the second diagonal direction.

In correspondence with the Bayer pattern arranged as illustrated in (B) of FIG. 3, the new pattern may be arranged as follows. In the first sub-pixel array, a pair of pixels each having a blue filter B may be disposed in the first diagonal direction, and a pair of pixels each having a cyan filter C may be disposed in the second diagonal direction. In the second sub-pixel array, a pair of pixels each having a red filter R may be disposed in the first diagonal direction, and a pair of pixels each having a magenta filter M may be disposed in the second diagonal direction. In the third sub-pixel array, a pair of pixels each having a green filter G may be disposed in the second diagonal direction, and a pair of pixels each having a yellow filter Y may be disposed in the first diagonal direction. In the fourth sub-pixel array, a pair of pixels each having a green filter G may be disposed in the second diagonal direction, and a pair of pixels each having a yellow filter Y may be disposed in the first diagonal direction.

The Bayer pattern may be arranged as illustrated in (C) of FIG. 3. For example, in the Bayer pattern in the unit of 2×2 pixels, a pixel having a red filter R and a pixel having a blue filter B may be sequentially disposed in the first diagonal direction, and a pair of pixels each having a green filter G may be disposed in the second diagonal direction.

In correspondence with the Bayer pattern arranged as illustrated in (C) of FIG. 3, the new pattern may be arranged as follows. In the first sub-pixel array, a pair of pixels each having a red filter R may be disposed in the first diagonal direction, and a pair of pixels each having a magenta filter M may be disposed in the second diagonal direction. In the second sub-pixel array, a pair of pixels each having a blue filter B may be disposed in the first diagonal direction, and a pair of pixels each having a cyan filter C may be disposed in the second diagonal direction. In the third sub-pixel array, a pair of pixels each having a green filter G may be disposed in the second diagonal direction, and a pair of pixels each having a yellow filter Y may be disposed in the first diagonal direction. In the fourth sub-pixel array, a pair of pixels each having a green filter G may be disposed in the second diagonal direction, and a pair of pixels each having a yellow filter Y may be disposed in the first diagonal direction.

The Bayer pattern may be arranged as illustrated in (D) of FIG. 3. For example, in the Bayer pattern in the unit of 2×2 pixels, a pair of pixels each having a green filter G may be disposed in the first diagonal direction, and a pixel having a red filter R and a pixel having a blue filter B may be sequentially disposed in the second diagonal direction.

In correspondence with the Bayer pattern arranged as illustrated in (D) of FIG. 3, the new pattern may be arranged as follows. In the first sub-pixel array, a pair of pixels each having a green filter G may be disposed in the first diagonal direction, and a pair of pixels each having a yellow filter Y may be disposed in the second diagonal direction. In the second sub-pixel array, a pair of pixels each having a green filter G may be disposed in the first diagonal direction, and a pair of pixels each having a yellow filter Y may be disposed in the second diagonal direction. In the third sub-pixel array, a pair of pixels each having a blue filter B may be disposed in the second diagonal direction, and a pair of pixels each having a cyan filter C may be disposed in the first diagonal direction. In the fourth sub-pixel array, a pair of pixels each having a red filter R may be disposed in the second diagonal direction, and a pair of pixels each having a magenta filter M may be disposed in the first diagonal direction.

Figures 4, 5:
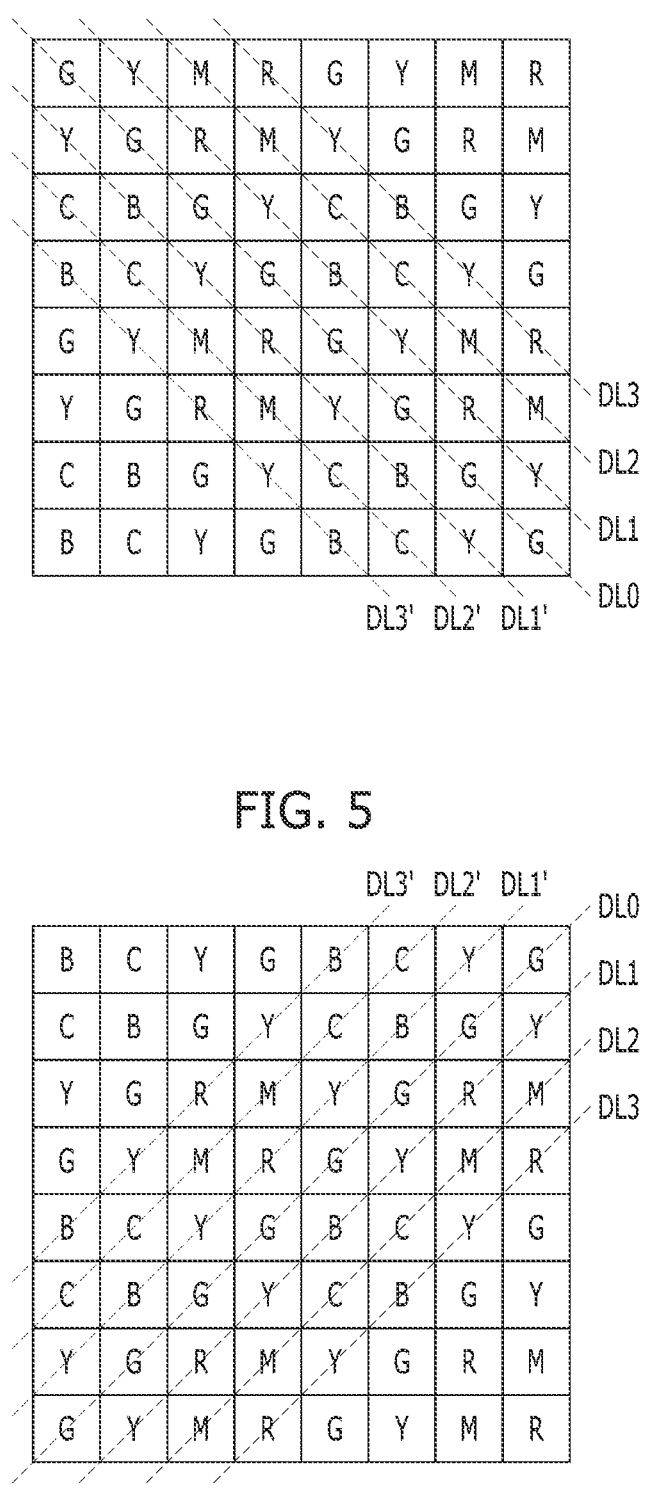

FIG. 4 is a diagram illustrating the example of (A) in FIG. 3 of the new pattern corresponding to the 4×4 unit pixel structure illustrated in FIG. 3 expanded to an 8×8 pixel structure in accordance with an embodiment of the present disclosure.

Referring to FIG. 4, the pixel array 110 according to the example of (A) in FIG. 3 may include pixels arranged along first to seventh diagonal lines DL0 to DL3 and DL1' to DL3'. The first diagonal line DL0 may extend in the first diagonal direction. The second diagonal line DL1 may be adjacent to the second diagonal direction on the basis of the first diagonal line DL0, and extend parallel to the first diagonal line DL0. The third diagonal line DL2 may be adjacent to the second diagonal direction on the basis of the second diago-nal line DL1, and extend parallel to the second diagonal line DL1. The fourth diagonal line DL3 may be adjacent to the second diagonal direction on the basis of the third diagonal line DL2, and extend parallel to the third diagonal line DL2. The fifth diagonal line DL1' may be adjacent to an opposite direction of the second diagonal direction on the basis of the first diagonal line DL0, and extend parallel to the first diagonal line DL0. The sixth diagonal line DL2' may be adjacent to the opposite direction on the basis of the fifth diagonal line DL1', and extend parallel to the fifth diagonal line DL1'. The seventh diagonal line DL3' may be adjacent to the opposite direction on the basis of the sixth diagonal line DL2', and extend parallel to the sixth diagonal line DL2'.

The pixel array 110 may include first pixels disposed along the first diagonal line DL0 and each having a green filter G.

The pixel array 110 may include second pixels each having a yellow filter Y, third pixels each having a red filter R, and fourth pixels each having a blue filter B, the second to fourth pixels being disposed along the second diagonal line DL1. The second to fourth pixels may be repeatedly disposed in the order of a pixel having the yellow filter Y, a pixel having the red filter R, a pixel having the yellow filter Y and a pixel having the blue filter B.

The pixel array 110 may include fifth pixels each having a magenta filter M and sixth pixels each having a cyan filter C, the fifth and sixth pixels being disposed along the third diagonal line DL2. The fifth and sixth pixels may be repeatedly disposed in the order of a pixel having the magenta filter M, a pixel having the magenta filter M, a pixel having the cyan filter C and a pixel having the cyan filter C.

The pixel array 110 may include seventh pixels each having a red filter R, eighth pixels each having a yellow filter Y and ninth pixels each having a blue filter B, the seventh to ninth pixels being disposed along the fourth diagonal line DL3. The seventh to ninth pixels may be repeatedly disposed in the order of a pixel having the red filter R, a pixel having the yellow filter Y, a pixel having the blue filter B and a pixel having the yellow filter Y.

The pixel array 110 may include $10^{th}$ pixels each having a yellow filter Y, $11^{th}$ pixels each having a blue filter B and $12^{th}$ pixels each having a red filter R, the $10^{th}$ to $12^{th}$ pixels being disposed along the fifth diagonal line DL1'. The $10^{th}$ to $12^{th}$ pixels may be repeatedly disposed in the order of a pixel having the yellow filter Y, a pixel having the blue filter B, a pixel having the yellow filter Y and a pixel having the red filter R.

The pixel array 110 may include $13^{th}$ pixels each having a magenta filter M and $14^{th}$ pixels each having a cyan filter C, the $13^{th}$ and $14^{th}$ pixels being disposed along the sixth diagonal line DL2'. The $13^{th}$ and $14^{th}$ pixels may be repeatedly disposed in the order of a pixel having the cyan filter C, a pixel having the cyan filter C, a pixel having the magenta filter M and a pixel having the magenta filter M.

The pixel array 110 may include $15^{th}$ pixels each having a blue filter B, $16^{th}$ pixels each having a yellow filter Y and $17^{th}$ pixels each having a red filter R, the $15^{th}$ to $17^{th}$ pixels being disposed along the seventh diagonal line DL3'. The $15^{th}$ to $17^{th}$ pixels may be repeatedly disposed in the order of a pixel having the blue filter B, a pixel having the yellow filter Y, a pixel having the red filter R and a pixel having the yellow filter Y.

FIG. 5 is a diagram illustrating the example of (B) in FIG. 3 of the new pattern corresponding to the 4×4 unit pixel structure illustrated in FIG. 3 expanded to an 8×8 pixel structure.

Referring to FIG. 5, the pixel array 110 according to the example of (B) in FIG. 3 may include pixels arranged along first to seventh diagonal lines DL0 to DL3 and DL1' to DL3'. The first diagonal line DL0 may extend in the second diagonal direction. The second diagonal line DL1 may be adjacent to the first diagonal direction on the basis of the first diagonal line DL0, and extend parallel to the first diagonal line DL0. The third diagonal line DL2 may be adjacent to the first diagonal direction on the basis of the second diagonal line DL1, and extend parallel to the second diagonal line DL1. The fourth diagonal line DL3 may be adjacent to the first diagonal direction on the basis of the third diagonal line DL2, and extend parallel to the third diagonal line DL2. The fifth diagonal line DL1' may be adjacent to an opposite direction of the first diagonal direction on the basis of the first diagonal line DL0, and extend parallel to the first diagonal line DL0. The sixth diagonal line DL2' may be adjacent to the opposite direction on the basis of the fifth diagonal line DL1', and extend parallel to the fifth diagonal line DL1'. The seventh diagonal line DL3' may be adjacent to the opposite direction on the basis of the sixth diagonal line DL2', and extend parallel to the sixth diagonal line DL2'.

The pixel array 110 may include first pixels disposed along the first diagonal line DL0 and each having a green filter G.

The pixel array 110 may include second pixels each having a yellow filter Y, third pixels each having a red filter R, and fourth pixels each having a blue filter B, the second to fourth pixels being disposed along the second diagonal line DL1. The second to fourth pixels may be repeatedly disposed in the order of a pixel having the yellow filter Y, a pixel having the red filter R, a pixel having the yellow filter Y and a pixel having the blue filter B.

The pixel array 110 may include fifth pixels each having a magenta filter M and sixth pixels each having a cyan filter C, the fifth and sixth pixels being disposed along the third diagonal line DL2. The fifth and sixth pixels may be repeatedly disposed in the order of a pixel having the magenta filter M, a pixel having the magenta filter M, a pixel having the cyan filter C and a pixel having the cyan filter C.

The pixel array 110 may include seventh pixels each having a red filter R, eighth pixels each having a yellow filter Y and ninth pixels each having a blue filter B, the seventh to ninth pixels being disposed along the fourth diagonal line DL3. The seventh to ninth pixels may be repeatedly disposed in the order of a pixel having the red filter R, a pixel having the yellow filter Y, a pixel having the blue filter B and a pixel having the yellow filter Y.

The pixel array 110 may include $10^{th}$ pixels each having a yellow filter Y, $11^{th}$ pixels each having a blue filter B and $12^{th}$ pixels each having a red filter R, the $10^{th}$ to $12^{th}$ pixels being disposed along the fifth diagonal line DL1'. The $10^{th}$ to $12^{th}$ pixels may be repeatedly disposed in the order of a pixel having the yellow filter Y, a pixel having the blue filter B, a pixel having the yellow filter Y and a pixel having the red filter R.

The pixel array 110 may include $13^{th}$ pixels each having a magenta filter M and $14^{th}$ pixels each having a cyan filter C, the $13^{th}$ and $14^{th}$ pixels being disposed along the sixth diagonal line DL2'. The $13^{th}$ and $14^{th}$ pixels may be repeatedly disposed in the order of a pixel having the cyan filter C, a pixel having the cyan filter C, a pixel having the magenta filter M and a pixel having the magenta filter M, The pixel array 110 may include $15^{th}$ pixels each having a blue filter B, $16^{th}$ pixels each having a yellow filter Y and $17^{th}$ pixels each having a red filter R, the $15^{th}$ to $17^{th}$ pixels being disposed along the seventh diagonal line DL3'. The $15^{th}$ to $17^{th}$ pixels may be repeatedly disposed in the order of a pixel having the blue filter B, a pixel having the yellow filter Y, a pixel having the red filter R and a pixel having the yellow filter Y.

Figures 6, 7:
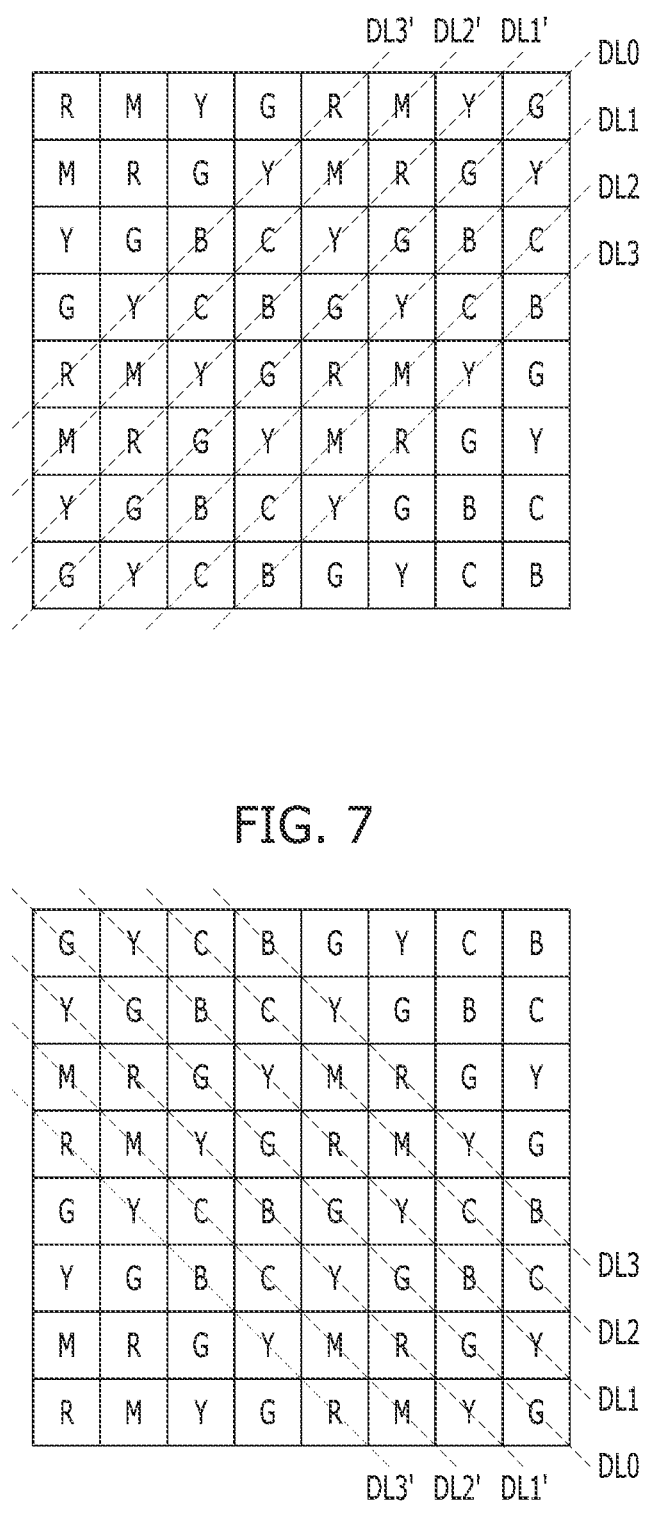

FIG. 6 is a diagram illustrating the example of (C) in FIG. 3 of the new pattern corresponding to the 4×4 unit pixel structure illustrated in FIG. 3 expanded to an 8×8 pixel structure in accordance with an embodiment of the present disclosure.

Referring to FIG. 6, the pixel array 110 according to the example of (C) in FIG. 3 may include pixels arranged along first to seventh diagonal lines DL0 to DL3 and DU' to DL3'. The first diagonal line DL0 may extend in the second diagonal direction. The second diagonal line DL1 may be adjacent to the first diagonal direction on the basis of the first diagonal line DL0, and extend parallel to the first diagonal line DL0. The third diagonal line DL2 may be adjacent to the first diagonal direction on the basis of the second diagonal line DL1, and extend parallel to the second diagonal line DL1. The fourth diagonal line DL3 may be adjacent to the first diagonal direction on the basis of the third diagonal line DL2, and extend parallel to the third diagonal line DL2. The fifth diagonal line DL1' may be adjacent to an opposite direction of the first diagonal direction on the basis of the first diagonal line DL0, and extend parallel to the first diagonal line DL0. The sixth diagonal line DL2' may be adjacent to the opposite direction on the basis of the fifth diagonal line DL1', and extend parallel to the fifth diagonal line DL1'. The seventh diagonal line DL3' may be adjacent to the opposite direction on the basis of the sixth diagonal line DL2', and extend parallel to the sixth diagonal line DL2'.

The pixel array 110 may include first pixels disposed along the first diagonal line DL0 and each having a green filter G.

The pixel array 110 may include second pixels each having a yellow filter Y, third pixels each having a blue filter B, and fourth pixels each having a red filter R, the second to fourth pixels being disposed along the second diagonal line DLL The second to fourth pixels may be repeatedly disposed in the order of a pixel having the yellow filter Y, a pixel having the blue filter B, a pixel having the yellow filter Y and a pixel having the red filter R.

The pixel array 110 may include fifth pixels each having a magenta filter M and sixth pixels each having a cyan filter C, the fifth and sixth pixels being disposed along the third diagonal line DL2. The fifth and sixth pixels may be repeatedly disposed in the order of a pixel having the cyan filter C, a pixel having the cyan filter C, a pixel having the magenta filter M and a pixel having the magenta filter M.

The pixel array 110 may include seventh pixels each having a blue filter B, eighth pixels each having a yellow filter Y and ninth pixels each having a red filter R, the seventh to ninth pixels being disposed along the fourth diagonal line DL3. The seventh to ninth pixels may be repeatedly disposed in the order of a pixel having the blue filter B, a pixel having the yellow filter Y, a pixel having the red filter R and a pixel having the yellow filter Y.

The pixel array 110 may include $10^{th}$ pixels each having a yellow filter Y, $11^{th}$ pixels each having a red filter R and $12^{th}$ pixels each having a blue filter B, the $10^{th}$ to $12^{th}$ pixels being disposed along the fifth diagonal line DL1'. The $10^{th}$ to $12^{th}$ pixels may be repeatedly disposed in the order of a pixel having the yellow filter Y, a pixel having the red filter R, a pixel having the yellow filter Y and a pixel having the blue filter B.

The pixel array 110 may include 13th pixels each having a magenta filter M and 14th pixels each having a cyan filter C, the 13th and 14th pixels being disposed along the sixth diagonal line DL2'. The 13th and 14th pixels may be repeatedly disposed in the order of a pixel having the magenta filter M, a pixel having the magenta filter M, a pixel having the cyan filter C and a pixel having the cyan filter C.

The pixel array 110 may include 15th pixels each having a red filter R, 16th pixels each having a yellow filter Y and 17th pixels each having a blue filter B, the 15th to 17th pixels being disposed along the seventh diagonal line DL3'. The 15th to 17th pixels may be repeatedly disposed in the order of a pixel having the red filter R, a pixel having the yellow filter Y, a pixel having the blue filter B and a pixel having the yellow filter Y.

FIG. 7 is a diagram illustrating the example of (D) in FIG. 3 of the new pattern corresponding to the 4×4 unit pixel structure illustrated in FIG. 3 expanded to an 8×8 pixel structure, in accordance with an embodiment of the present disclosure.

Referring to FIG. 7, the pixel array 110 according to the example of (D) in FIG. 3 may include pixels arranged along first to seventh diagonal lines DL0 to DL3 and DL1' to DL3'. The first diagonal line DL0 may extend in the first diagonal direction. The second diagonal line DL1 may be adjacent to the second diagonal direction on the basis of the first diagonal line DL0, and extend parallel to the first diagonal line DL0. The third diagonal line DL2 may be adjacent to the second diagonal direction on the basis of the second diagonal line DL1, and extend parallel to the second diagonal line DL1. The fourth diagonal line DL3 may be adjacent to the second diagonal direction on the basis of the third diagonal line DL2, and extend parallel to the third diagonal line DL2. The fifth diagonal line DL1' may be adjacent to an opposite direction of the second diagonal direction on the basis of the first diagonal line DL0, and extend parallel to the first diagonal line DL0. The sixth diagonal line DL2' may be adjacent to the opposite direction on the basis of the fifth diagonal line DL1', and extend parallel to the fifth diagonal line DL1'. The seventh diagonal line DL3' may be adjacent to the opposite direction on the basis of the sixth diagonal line DL2', and extend parallel to the sixth diagonal line DL2'.

The pixel array 110 may include first pixels disposed along the first diagonal line DL0 and each having a green filter G.

The pixel array 110 may include second pixels each having a yellow filter Y, third pixels each having a blue filter B, and fourth pixels each having a red filter R, the second to fourth pixels being disposed along the second diagonal line DL1. The second to fourth pixels may be repeatedly disposed in the order of a pixel having the yellow filter Y, a pixel having the blue filter B, a pixel having the yellow filter Y and a pixel having the red filter R.

The pixel array 110 may include fifth pixels each having a magenta filter M and sixth pixels each having a cyan filter C, the fifth and sixth pixels being disposed along the third diagonal line DL2. The fifth and sixth pixels may be repeatedly disposed in the order of a pixel having the cyan filter C, a pixel having the cyan filter C, a pixel having the magenta filter M and a pixel having the magenta filter M.

The pixel array 110 may include seventh pixels each having a blue filter B, eighth pixels each having a yellow filter Y and ninth pixels each having a red filter R, the seventh to ninth pixels being disposed along the fourth diagonal line DL3. The seventh to ninth pixels may be repeatedly disposed in the order of a pixel having the blue filter B, a pixel having the yellow filter Y, a pixel having the red filter R and a pixel having the yellow filter Y.

The pixel array 110 may include 10th pixels each having a yellow filter Y, 11th pixels each having a red filter R and 12th pixels each having a blue filter B, the 10th to 12th pixels being disposed along the fifth diagonal line DL1'. The 10th to 12th pixels may be repeatedly disposed in the order of a pixel having the yellow filter Y, a pixel having the red filter R, a pixel having the yellow filter Y and a pixel having the blue filter B.

The pixel array 110 may include 13th pixels each having a magenta filter M and 14th pixels each having a cyan filter C, the 13th and 14th pixels being disposed along the sixth diagonal line DL2'. The 13th and 14th pixels may be repeatedly disposed in the order of a pixel having the magenta filter M, a pixel having the magenta filter M, a pixel having the cyan filter C and a pixel having the cyan filter C.

The pixel array 110 may include 15th pixels each having a red filter R, 16th pixels each having a yellow filter Y and 17th pixels each having a blue filter B, the 15th to 17th pixels being disposed along the seventh diagonal line DL3'. The 15th to 17th pixels may be repeatedly disposed in the order of a pixel having the red filter R, a pixel having the yellow filter Y, a pixel having the blue filter B and a pixel having the yellow filter Y.

Figure 8:
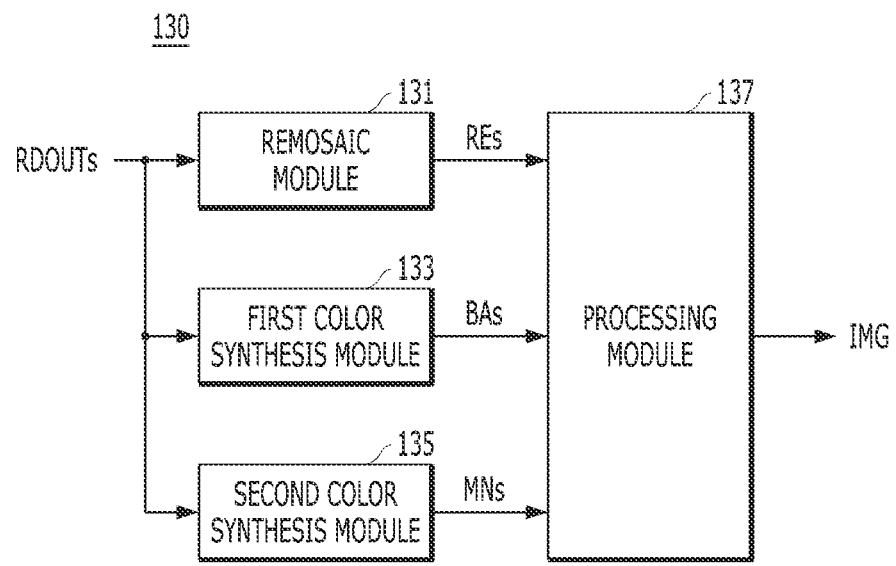
FIG. 8 is a block diagram illustrating an image processing circuit illustrated in FIG. 1 in accordance with an embodiment of the present disclosure.

FIG. 8 is a block diagram illustrating the image processing circuit 130 illustrated in FIG. 1 in accordance with an embodiment of the present disclosure.

Referring to FIG. 8, the image processing circuit 130 may include a remosaic module 131, a first color synthesis module 133, a second color synthesis module 135 and a processing module 137.

The remosaic module 131 may be enabled in a remosaic operation mode. The remosaic operation mode may be performed in a high-contrast mode and a low-contrast mode, but it may be more advantageous that the remosaic operation mode is performed in the high-contrast mode. The remosaic module 131 may generate remosaic signals REs corresponding to the Bayer pattern, on the basis of readout signals RDOUTs. For example, the remosaic module 131 may convert first readout signals corresponding to the first sub-pixel array into first remosaic signals corresponding to the Bayer pattern, convert second readout signals corresponding to the second sub-pixel array into second remosaic signals corresponding to the Bayer pattern, convert third readout signals corresponding to the third sub-pixel array into third remosaic signals corresponding to the Bayer pattern, and convert fourth readout signals corresponding to the fourth sub-pixel array into fourth remosaic signals corresponding to the Bayer pattern. The first to fourth remosaic signals may correspond to the remosaic signals REs.

The first color synthesis module 133 may be enabled in a first color synthesis operation mode. The first color synthesis operation mode may be performed in a high-contrast mode and a low-contrast mode, but it may be more advantageous that the first color synthesis operation mode is performed in the low-contrast mode. The first color synthesis module 133 may generate first color synthesis signals BAs corresponding to the Bayer pattern, on the basis of the first to fourth readout signals. For example, the first color synthesis module 133 may generate a first color synthesis signal by synthesizing some of the first readout signals, generate a second color synthesis signal by synthesizing some of the second readout signals, generate a third color synthesis signal by synthesizing some of the third readout signals, and generate a fourth color synthesis signal by synthesizing some of the fourth readout signals. The first color synthesis module 133 may apply the other first readout signals except for the some of the first readout signals, the other second readout signals except for the some of the second readout signals, the other third readout signals except for the some of the third readout signals, and the other fourth readout signals except for the some of the fourth readout signals to the first to fourth color synthesis signals (refer to Equations 1 to 4). The first to fourth color synthesis signals may correspond to the first color synthesis signals BAs.

The second color synthesis module 135 may be enabled in a second color synthesis operation mode. The second color synthesis operation mode may be performed in a high-contrast mode and a low-contrast mode, but it may be more advantageous that the second color synthesis operation mode is performed in the low-contrast mode. The second color synthesis module 135 may generate second color synthesis signals MNs corresponding to the Bayer pattern, on the basis of the first to fourth readout signals. For example, the second color synthesis module 135 may generate a fifth color synthesis signal by synthesizing the first readout signals, generate a sixth color synthesis signal by synthesizing the second readout signals, generate a seventh color synthesis signal by synthesizing the third readout signals, and generate an eighth color synthesis signal by synthesizing the fourth readout signals (refer to Equations 5 to 8). The fifth to eighth color synthesis signals may correspond to the second color synthesis signals MNs.

The processing module 137 may generate the image IMG on the basis of any of the remosaic signals REs, the first color synthesis signals BAs and the second color synthesis signals MNs. For example, the processing module 137 may generate the image IMG on the basis of the remosaic signals REs in the remosaic operation mode, generate the image IMG on the basis of the first color synthesis signals BAs in the first color synthesis operation mode, and generate the image IMG on the basis of the second color synthesis signals MNs in the second color synthesis operation mode.

Hereinafter, an operation of the image sensor 100 in accordance with an embodiment, which has the above-described configuration, is described with reference to FIGS. 9 to 11. It is described as an example that the pixel array 110 has the new pattern illustrated in (A) of FIG. 3.

Figure 9:
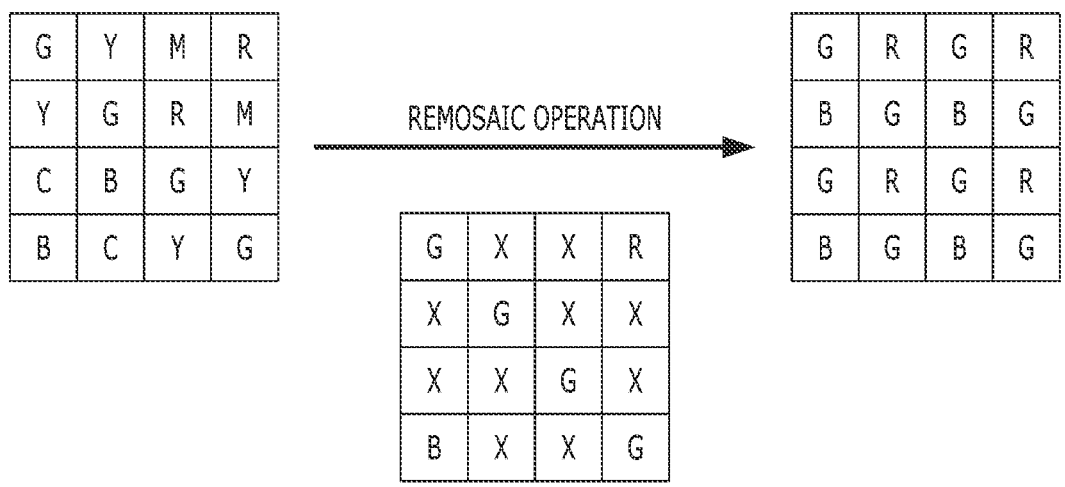
FIG. 9 is a diagram illustrating a remosaic operation according to a remosaic operation mode among operations of the image sensor illustrated in FIG. 1 in accordance with an embodiment of the present disclosure.

FIG. 9 is a diagram illustrating a remosaic operation according to the remosaic operation mode among the operations of the image sensor 100 illustrated in FIG. 1 in accordance with an embodiment of the present disclosure.

Referring to FIG. 9, the remosaic module 131 may convert the readout signals RDOUTs corresponding to the new pattern into the remosaic signals REs corresponding to the Bayer pattern. For example, the remosaic module 131 may convert ten readout signals (marked with "X" in FIG. 9), which are different from the Bayer pattern among the readout signals RDOUTs corresponding to the new pattern, into corresponding ten remosaic signals through interpolation. In addition, the remosaic module 131 may bypass six readout signals, which are the same as the Bayer pattern among the readout signals RDOUTs corresponding to the new pattern, and map the bypassed readout signals to corresponding six remosaic signals. As only the ten readout signals "X" among sixteen readout signals RDOUTs corresponding to the new pattern are converted into the corresponding ten remosaic signals, deterioration in luminance resolution may be reduced. Since the remosaic operation of the remosaic module 131 is publicly known and used art, detailed descriptions thereof are omitted. However, when the remosaic module 131 interpolates the ten readout signals "X", the remosaic module 131 may apply readout signals corresponding to peripheral pixels, that is, pixels each having a yellow filter Y, pixels each having a magenta filter M, and pixels each having a cyan filter C, thereby improving a signal-to-noise ratio (SNR) of each of the ten remosaic signals.

Figure 10:
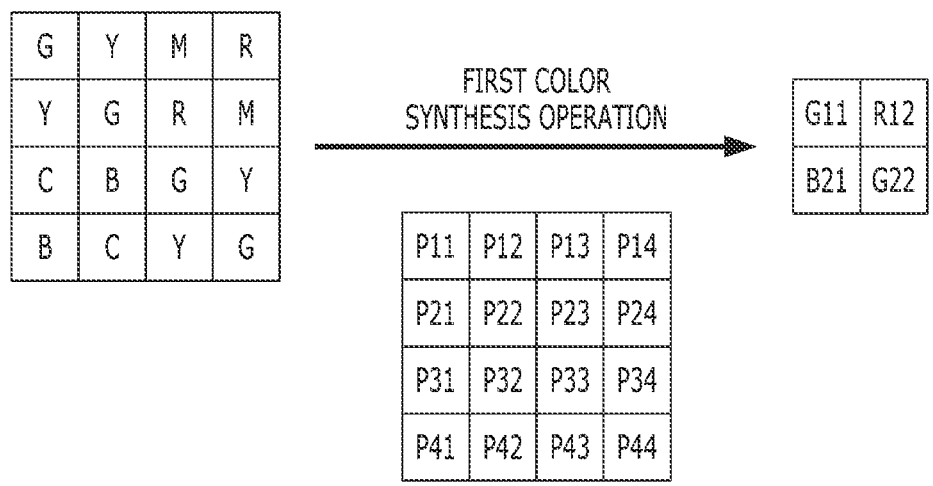
FIG. 10 is a diagram illustrating a first color synthesis operation according to a first color synthesis operation mode among the operations of the image sensor illustrated in FIG. 1 in accordance with an embodiment of the present disclosure.

FIG. 10 is a diagram illustrating a first color synthesis operation according to the first color synthesis operation mode among the operations of the image sensor 100 illustrated in FIG. 1 in accordance with an embodiment of the present disclosure.

Referring to FIG. 10, the first color synthesis module 133 may generate a first color synthesis signal G11 by synthesizing some first readout signals P11 and P22 of first readout signals P11, P12, P21 and P22 corresponding to the first sub-pixel array, generate a second color synthesis signal G22 by synthesizing some second readout signals P33 and P44 of second readout signals P33, P34, P43 and P44 corresponding to the second sub-pixel array, generate a third color synthesis signal R12 by synthesizing some third readout signals P14 and P23 of third readout signals P13, P14, P23 and P24 corresponding to the third sub-pixel array, and generate a fourth color synthesis signal B21 by synthesizing some fourth readout signals P32 and P41 of fourth readout signals P31, P32, P41 and P42 corresponding to the fourth sub-pixel array. In addition, the first color synthesis module 133 may apply the other first readout signals P12 and P21 except for the first readout signals P11 and P22 among the first readout signals P11, P12, P21 and P22, the other second readout signals P34 and P43 except for the second readout signals P33 and P44 among the second readout signals P33, P34, P43 and P44, the other third readout signals P13 and P24 except for the third readout signals P14 and P23 among the third readout signals P13, P14, P23 and P24, and the other fourth readout signals P31 and P42 except for the fourth readout signals P32 and P41 among the fourth readout signals P31, P32, P41 and P42 to the first to fourth color synthesis signals G11, G22, R12 and B21.

For example, the first color synthesis signal G11 may be calculated by Equation 1 below, the second color synthesis signal G22 may be calculated by Equation 2 below, and the third color synthesis signal R12 may be calculated by Equation 3 below, and the fourth color synthesis signal B21 may be calculated by Equation 4 below.

$$G11 = (P11 + P22) \times \frac{0.5(P12 + P21)}{\sum_{i,j \in ROI} Y_{i,j}}$$ [Equation 1]

$$G22 = (P33 + P44) \times \frac{0.5(P34 + P43)}{\sum_{i,j \in ROI} Y_{i,j}}$$ [Equation 2]

$$R12 = (P14 + P23) \times \frac{0.5(P13 + P24)}{\sum_{i,j \in ROI} M_{i,j}}$$ [Equation 3]

$$B21 = (P32 + P41) \times \frac{0.5(P31 + P42)}{\sum_{i,j \in ROI} C_{i,j}}$$ [Equation 4]

Herein, "$\Sigma_{i,j \in ROI} Y_{i,j}$" denotes an average value of the readout signals, which correspond to the pixels each having the yellow filter, in a region of interest that is set with respect to each of the first and second sub-pixel arrays. "$\Sigma_{i,j \in ROI} M_{i,j}$" denotes an average value of the readout signals, which correspond to the pixels each having the magenta filter, in a region of interest that is set with respect to the third sub-pixel array. "$\Sigma_{i,j \in ROI} C_{i,j}$" denotes an average value of the readout signals, which correspond to the pixels each having the cyan filter, in a region of interest that is set with respect to the fourth sub-pixel array.

The first color synthesis module 133 may apply the other first readout signals P12 and P21 of the pixels each having the yellow filter among the first readout signals P11, P12, P21 and P22 to the first color synthesis signal G11, thereby improving a signal-to-noise ratio (SNR) of the first color synthesis signal G11, The first color synthesis module 133 may apply the other second readout signals P34 and P43 of the pixels each having the yellow filter among the second readout signals P33, P34, P43 and P44 to the second color synthesis signal G22, thereby improving a signal-to-noise ratio (SNR) of the second color synthesis signal G22. The first color synthesis module 133 may apply the other third readout signals P13 and P24 of the pixels each having the magenta filter among the third readout signals P13, P14, P23 and P24 to the third color synthesis signal R12, thereby improving a signal-to-noise ratio (SNR) of the third color synthesis signal R12. The first color synthesis module 133 may apply the other fourth readout signals P31 and P42 of the pixels each having the cyan filter among the fourth readout signals P31, P32, P41 and P42 to the fourth color synthesis signal B21, thereby improving a signal-to-noise ratio (SNR) of the fourth color synthesis signal B21.

Figure 11:
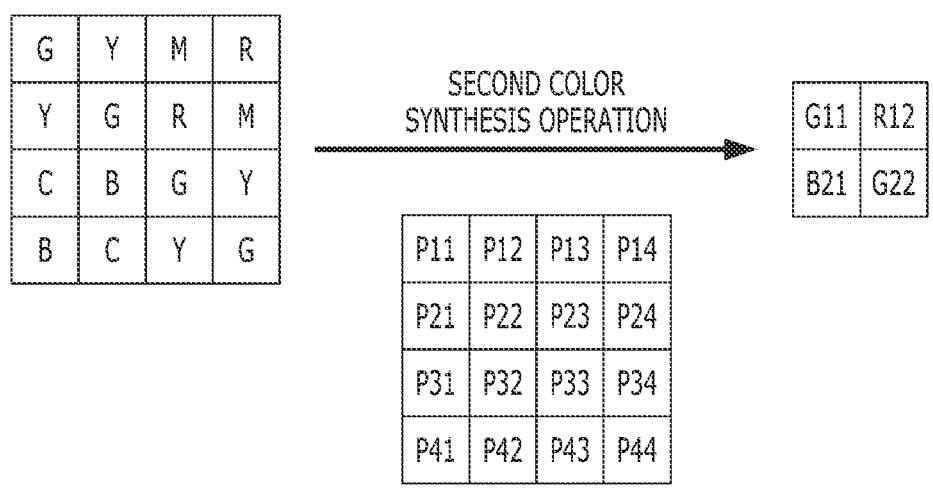
FIG. 11 is a diagram illustrating a second color synthesis operation according to a second color synthesis operation mode among the operations of the image sensor illustrated in FIG. 1 in accordance with an embodiment of the present disclosure.

FIG. 11 is a diagram illustrating a second color synthesis operation according to the second color synthesis operation mode among the operations of the image sensor 100 illustrated in FIG. 1 in accordance with an embodiment of the present disclosure.

Referring to FIG. 11, the second color synthesis module 135 may generate a fifth color synthesis signal G11 by synthesizing the first readout signals P11, P12, P21 and P22 corresponding to the first sub-pixel array, generate a sixth color synthesis signal G22 by synthesizing the second readout signals P33, P34, P43 and P44 corresponding to the second sub-pixel array, generate a seventh color synthesis signal R12 by synthesizing the third readout signals P13, P14, P23 and P24 corresponding to the third sub-pixel array, and generate an eighth color synthesis signal B21 by synthesizing the fourth readout signals P31, P32, P41 and P42 corresponding to the fourth sub-pixel array.

For example, the fifth color synthesis signal G11 may be calculated by Equation 5 below, the sixth color synthesis signal G22 may be calculated by Equation 6 below, and the seventh color synthesis signal R12 may be calculated by Equation 7 below, and the eighth color synthesis signal B21 may be calculated by Equation 8 below.

$$G11=P11+P22-P12+P21 \quad \text{[Equation 5]}$$

$$G22=P33+P44+P34+P43 \quad \text{[Equation 6]}$$

$$R12=P14+P23+P13+P24 \quad \text{[Equation 7]}$$

$$B21=P32+P41+P31+P42 \quad \text{[Equation 8]}$$

According to an embodiment of the present disclosure, as a pixel array having a new pattern is proposed, it is possible to generate an optimal image in a high-contrast mode and a low-contrast mode.

According to an embodiment of the present disclosure, as a pattern of a pixel array is newly proposed, it is possible to improve a signal-to-noise ratio (SNR) in a low-contrast mode and support a high-resolution in a high-contrast mode.

While the present disclosure has been illustrated and described with respect to specific embodiments, the disclosed embodiments are provided for the description, and not intended to be restrictive. Moreover, it is noted that the present disclosure may be achieved in various ways through substitution, change, and modification that fall within the scope of the following claims, as those skilled in the art will recognize in light of the present disclosure. Furthermore, the embodiments may be combined to form additional embodiments.

What is claimed is:

1. An image sensor comprising a pixel array having a 4×4 unit pixel structure,
wherein the pixel array includes:
a first sub-pixel array including first and second pixels disposed in a first diagonal direction and each having a green filter, and third and fourth pixels disposed in a second diagonal direction and each having a yellow filter, the first and second diagonal directions intersecting each other;
a second sub-pixel array including fifth and sixth pixels disposed in the first diagonal direction and each having the green filter, and seventh and eighth pixels disposed in the second diagonal direction and each having the yellow filter;
a third sub-pixel array including ninth and $10^{th}$ pixels disposed in the second diagonal direction and each having a red filter, and $11^{th}$ and $12^{th}$ pixels disposed in the first diagonal direction and each having a magenta filter; and
a fourth sub-pixel array including $13^{th}$ and $14^{th}$ pixels disposed in the second diagonal direction and each having a blue filter, and $15^{th}$ and $16^{th}$ pixels disposed in the first diagonal direction and each having a cyan filter.

2. The image sensor of claim 1,
wherein the first and second sub-pixel arrays are disposed in the first diagonal direction in the 4×4 unit pixel structure, and
wherein the third and fourth sub-pixel arrays are disposed in the second diagonal direction in the 4×4 unit pixel structure.

3. The image sensor of claim 1,
wherein the first sub-pixel array is disposed on a top left in the 4×4 unit pixel structure,
wherein the second sub-pixel array is disposed on a bottom right in the 4×4 unit pixel structure,
wherein the third sub-pixel array is disposed on a top right in the 4×4 unit pixel structure, and
wherein the fourth sub-pixel array is disposed on a bottom left in the 4×4 unit pixel structure.

4. The image sensor of claim 1,
wherein the first sub-pixel array is disposed on a top right in the 4×4 unit pixel structure,
wherein the second sub-pixel array is disposed on a bottom left in the 4×4 unit pixel structure,
wherein the third sub-pixel array is disposed on a bottom right in the 4×4 unit pixel structure, and
wherein the fourth sub-pixel array is disposed on a top left in the 4×4 unit pixel structure.

5. The image sensor of claim 1,
wherein the first sub-pixel array is disposed on a top right in the 4×4 unit pixel structure,
wherein the second sub-pixel array is disposed on a bottom left in the 4×4 unit pixel structure,
wherein the third sub-pixel array is disposed on a top left in the 4×4 unit pixel structure, and
wherein the fourth sub-pixel array is disposed on a bottom right in the 4×4 unit pixel structure.

6. The image sensor of claim 1,
wherein the first sub-pixel array is disposed on a top left in the 4×4 unit pixel structure,
wherein the second sub-pixel array is disposed on a bottom right in the 4×4 unit pixel structure,
wherein the third sub-pixel array is disposed on a bottom left in the 4×4 unit pixel structure, and
wherein the fourth sub-pixel array is disposed on a top right in the 4×4 unit pixel structure.

7. The image sensor of claim 1, further comprising:
a readout circuit suitable for generating readout signals based on pixel signals outputted from the pixel array; and
an image processing circuit suitable for generating, based on the readout signals, an image having a different pattern from the 4×4 unit pixel structure.

8. The image sensor of claim 7, wherein the image processing circuit includes:
a remosaic circuit suitable for converting, into respective first to fourth remosaic signals corresponding to a Bayer pattern, a group of first readout signals corresponding to the first sub-pixel array, a group of second readout signals corresponding to the second sub-pixel array, a group of third readout signals corresponding to the third sub-pixel array and a group of fourth readout signals corresponding to the fourth sub-pixel array respectively;
a first color synthesis circuit suitable for generating first color synthesis signals corresponding to the Bayer pattern by synthesizing a part of the first readout signals, synthesizing a part of the second readout signals, synthesizing a part of the third readout signals and synthesizing a part of the fourth readout signals;
a second color synthesis circuit suitable for generating second color synthesis signals corresponding to the Bayer pattern by synthesizing each of the respective groups of the first to fourth readout signals; and
a processing circuit suitable for generating the image based on any of the first to fourth remosaic signals, the first color synthesis signals and the second color synthesis signals.

9. The image sensor of claim 8, wherein the first color synthesis circuit is further suitable for applying, to the first color synthesis signals, remaining parts of the respective first to fourth readout signals.

10. The image sensor of claim 8,
wherein the remosaic circuit operates in a high-contrast mode, and
wherein the first and second color synthesis circuits operate in a low-contrast mode.

11. An image sensor comprising:
a pixel array including N×M pixels, where N and M are natural numbers greater than 2,
wherein the pixel array includes:
first pixels disposed along a first diagonal line and each having a green filter;
at least one second pixel having a yellow filter, at least one third pixel having a red filter and at least one fourth pixel having a blue filter, the second to fourth pixels being disposed along a second diagonal line parallel to the first diagonal line;
at least one fifth pixel having a magenta filter and at least one sixth pixel having a cyan filter, the fifth and sixth pixels being disposed along a third diagonal line parallel to the second diagonal line; and
at least one seventh pixel having the yellow filter, at least one eighth pixel having the red filter and at least one ninth pixel having the blue filter, the seventh to ninth pixels being disposed along a fourth diagonal line parallel to the third diagonal line.

12. The image sensor of claim 11, wherein the second to fourth pixels are repeatedly disposed:
in an order of a pixel having the yellow filter, a pixel having the red filter, a pixel having the yellow filter and a pixel having the blue filter, or
in an order of a pixel having the yellow filter, a pixel having the blue filter, a pixel having the yellow filter and a pixel having the red filter.

13. The image sensor of claim 11, wherein the fifth and sixth pixels are repeatedly disposed:
in an order of a pixel having the magenta filter, a pixel having the magenta filter, a pixel having the cyan filter and a pixel having the cyan filter, or
in an order of a pixel having the cyan filter, a pixel having the cyan filter, a pixel having the magenta filter and a pixel having the magenta filter.

14. The image sensor of claim 11, wherein the seventh to ninth pixels are repeatedly disposed:
in an order of a pixel having the red filter, a pixel having the yellow filter, a pixel having the blue filter and a pixel having the yellow filter, or
in an order of a pixel having the blue filter, a pixel having the yellow filter, a pixel having the red filter and a pixel having the yellow filter.

15. The image sensor of claim 11, wherein the pixel array further includes:
at least one $10^{th}$ pixel having the yellow filter, at least one $11^{th}$ pixel having the red filter and at least one $12^{th}$ pixel having the blue filter, the $10^{th}$ to $12^{th}$ pixels being disposed along a fifth diagonal line parallel to the first diagonal line;
at least one $13^{th}$ pixel having the magenta filter and at least one $14^{th}$ pixel having the cyan filter, the $13^{th}$ and $14^{th}$ pixels being disposed along a sixth diagonal line parallel to the fifth diagonal line; and
at least one $15^{th}$ pixel having the yellow filter, at least one $16^{th}$ pixel having the red filter and at least one $17^{th}$ pixel having the blue filter, the $15^{th}$ to $17^{th}$ pixels being disposed along a seventh diagonal line parallel to the sixth diagonal line.

16. The image sensor of claim 15, wherein the $10^{th}$ to $12^{th}$ pixels are repeatedly disposed:
in an order of a pixel having the yellow filter, a pixel having the red filter, a pixel having the yellow filter and a pixel having the blue filter, or
in an order of a pixel having the yellow filter, a pixel having the blue filter, a pixel having the yellow filter and a pixel having the red filter.

17. The image sensor of claim 15, wherein the $13^{th}$ and $14^{th}$ pixels are repeatedly disposed:
in an order of a pixel having the magenta filter, a pixel having the magenta filter, a pixel having the cyan filter and a pixel having the cyan filter, or
in an order of a pixel having the cyan filter, a pixel having the cyan filter, a pixel having the magenta filter and a pixel having the magenta filter.

18. The image sensor of claim 15, wherein the $15^{th}$ to $17^{th}$ pixels are repeatedly disposed:
in an order of a pixel having the red filter, a pixel having the yellow filter, a pixel having the blue filter and a pixel having the yellow filter, or
in an order of a pixel having the blue filter, a pixel having the yellow filter, a pixel having the red filter and a pixel having the yellow filter.

19. The image sensor of claim 11, further comprising:
- a readout circuit suitable for generating readout signals based on pixel signals outputted from the pixel array; and
- an image processing circuit suitable for generating, based on the readout signals, an image having a different pattern from the pixel array.

20. The image sensor of claim 19, wherein the image processing circuit includes:
- a remosaic circuit suitable for generating remosaic signals, which correspond to a Bayer pattern, based on the readout signals;
- a first color synthesis circuit suitable for generating first color synthesis signals, which correspond to the Bayer pattern, by synthesizing a part of the readout signals;
- a second color synthesis circuit suitable for generating second color synthesis signals, which correspond to the Bayer pattern, by synthesizing the readout signals; and
- a processing circuit suitable for generating the image based on any of the remosaic signals, the first color synthesis signals and the second color synthesis signals.

21. The image sensor of claim 20, wherein the first color synthesis circuit is further suitable for applying remaining parts of the readout signals to the first color synthesis signals.

22. The image sensor of claim 20,
- wherein the remosaic circuit operates in a high-contrast mode, and
- wherein the first and second color synthesis circuits operate in a low-contrast mode.

* * * * *